(12) United States Patent
Ranta et al.

(10) Patent No.: US 12,191,833 B2
(45) Date of Patent: *Jan. 7, 2025

(54) POWER AMPLIFIER SELF-HEATING COMPENSATION CIRCUIT

(71) Applicant: pSemi Corporation, San Diego, CA (US)

(72) Inventors: Tero Tapio Ranta, San Diego, CA (US); Keith Bargroff, San Diego, CA (US); Christopher C. Murphy, Lake Zurich, IL (US); Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 17/945,652

(22) Filed: Sep. 15, 2022

(65) Prior Publication Data

US 2023/0084770 A1 Mar. 16, 2023

Related U.S. Application Data

(63) Continuation of application No. 17/124,118, filed on Dec. 16, 2020, now Pat. No. 11,451,205, which is a (Continued)

(51) Int. Cl.
*H03F 1/30* (2006.01)
*H03F 1/56* (2006.01)
(Continued)

(52) U.S. Cl.
CPC ............. *H03G 3/3042* (2013.01); *H03F 1/30* (2013.01); *H03F 1/303* (2013.01); *H03F 1/304* (2013.01);
(Continued)

(58) Field of Classification Search
CPC .............. H03G 3/3042; H03G 3/3036; H03G 2201/106; H03F 1/30; H03F 1/303;
(Continued)

(56) References Cited

U.S. PATENT DOCUMENTS

| 4,749,889 A | 6/1988 | Lagoni et al. |
| 6,297,696 B1 | 10/2001 | Abdollahian et al. |

(Continued)

FOREIGN PATENT DOCUMENTS

| EP | 1615337 | 1/2006 |
| EP | 1869785 | 12/2007 |

(Continued)

OTHER PUBLICATIONS

Nguyen, Hieu P., Office Action received from the USPTO dated Nov. 9, 2018 for U.S. Appl. No. 16/025,873, 5 pgs.

(Continued)

*Primary Examiner* — Hieu P Nguyen
(74) *Attorney, Agent, or Firm* — Steinfl + Bruno, LLP

(57) ABSTRACT

Temperature compensation circuits and methods for adjusting one or more circuit parameters of a power amplifier (PA) to maintain approximately constant Gain versus time during pulsed operation sufficient to substantially offset self-heating of the PA. Some embodiments compensate for PA Gain "droop" due to self-heating using a Sample and Hold (S&H) circuit. The S&H circuit samples and holds an initial temperature of the PA at commencement of a pulse. Thereafter, the S&H circuit generates a continuous measurement that corresponds to the temperature of the PA during the remainder of the pulse. A Gain Control signal is generated that is a function of the difference between the initial temperature and the operating temperature of the PA as the PA self-heats for the duration of the pulse. The Gain Control signal is (Continued)

applied to one or more adjustable or tunable circuits within a PA to offset the Gain droop of the PA.

20 Claims, 14 Drawing Sheets

Related U.S. Application Data continuation of application No. 16/676,219, filed on Nov. 6, 2019, now Pat. No. 10,873,308, which is a continuation of application No. 16/025,873, filed on Jul. 2, 2018, now Pat. No. 10,483,929, which is a continuation of application No. 15/445,811, filed on Feb. 28, 2017, now Pat. No. 10,056,874.

(51) Int. Cl.
   *H03F 3/19* (2006.01)
   *H03F 3/21* (2006.01)
   *H03F 3/24* (2006.01)
   *H03G 3/30* (2006.01)

(52) U.S. Cl.
   CPC ............... *H03F 1/56* (2013.01); *H03F 3/19* (2013.01); *H03F 3/21* (2013.01); *H03F 3/245* (2013.01); *H03G 3/3036* (2013.01); *H03F 2200/222* (2013.01); *H03F 2200/318* (2013.01); *H03F 2200/387* (2013.01); *H03F 2200/447* (2013.01); *H03F 2200/451* (2013.01); *H03F 2200/468* (2013.01); *H03G 2201/106* (2013.01)

(58) Field of Classification Search
   CPC ... H03F 1/304; H03F 1/56; H03F 3/19; H03F 3/21; H03F 3/245; H03F 2200/222; H03F 2200/318; H03F 2200/387; H03F 2200/447; H03F 2200/451; H03F 2200/468
   USPC ................... 330/284, 289, 285, 296
   See application file for complete search history.

(56) References Cited

U.S. PATENT DOCUMENTS

| | | |
|---|---|---|
| 6,392,490 B1 | 5/2002 | Gramegna et al. |
| 6,731,171 B2 | 5/2004 | Yamashita |
| 6,790,116 B2 | 9/2004 | Inahashi |
| 6,804,502 B2 | 10/2004 | Burgener et al. |
| 6,831,504 B1 | 12/2004 | Holloway |
| 7,248,120 B2 | 7/2007 | Burgener et al. |
| 7,276,976 B2 | 10/2007 | Oh |
| 7,369,820 B2 | 5/2008 | Rahman |
| 7,649,418 B2 | 1/2010 | Matsui |
| 7,656,233 B2 | 2/2010 | Lee |
| 7,729,727 B2 | 6/2010 | Jeck et al. |
| 7,737,790 B1 | 6/2010 | Chen et al. |
| 7,859,243 B2 | 12/2010 | Lorenz |
| 7,910,993 B2 | 3/2011 | Brindle et al. |
| 8,022,755 B2 | 9/2011 | Gomez |
| 8,441,320 B2 | 5/2013 | Signoff |
| 8,487,706 B2 | 7/2013 | Li et al. |
| 8,811,928 B2 | 8/2014 | Lennartson et al. |
| 8,892,063 B2 | 11/2014 | Jones et al. |
| 9,077,405 B2 | 7/2015 | Jones et al. |
| 9,083,287 B2 | 7/2015 | Papamichail |
| 9,148,088 B1 | 9/2015 | Ding |
| 9,178,493 B1 | 11/2015 | Nobbe |
| 9,219,445 B2 | 12/2015 | Nobbe et al. |
| 9,231,528 B2 | 1/2016 | Granger-Jones |
| 9,240,760 B2 | 1/2016 | Ishimoto et al. |
| 9,276,527 B2 | 3/2016 | Gaynor |
| 9,277,501 B2 | 3/2016 | Lorenz et al. |
| 9,294,056 B2 | 3/2016 | Nobbe et al. |
| 9,331,643 B2 | 5/2016 | Gaynor |
| 9,413,298 B2 | 8/2016 | Nobbe et al. |
| 9,419,565 B2 | 8/2016 | Nobbe et al. |
| 9,503,026 B2 | 11/2016 | Lam et al. |
| 9,509,263 B2 | 11/2016 | Lam |
| 9,535,110 B2 | 1/2017 | Nobbe |
| 9,553,550 B2 | 1/2017 | Puliafico et al. |
| 9,595,923 B2 | 3/2017 | Nobbe et al. |
| 9,602,063 B2 | 3/2017 | Kaatz et al. |
| 9,641,141 B1 | 5/2017 | Zheng |
| 9,647,631 B2 | 5/2017 | Gaynor |
| 9,716,477 B2 | 7/2017 | Wagh et al. |
| 9,748,905 B2 | 8/2017 | Scott et al. |
| 9,780,756 B2 | 10/2017 | Maxim |
| 9,837,965 B1 | 12/2017 | Wagh et al. |
| 9,843,293 B1 | 12/2017 | Wagh et al. |
| 9,864,000 B2 | 1/2018 | Nobbe et al. |
| 9,874,893 B2 | 1/2018 | Ciubotaru |
| 9,882,531 B1 | 1/2018 | Willard et al. |
| 10,038,409 B2 | 7/2018 | Nobbe |
| 10,056,874 B1 | 8/2018 | Ranta et al. |
| 10,184,973 B2 | 1/2019 | Nobbe et al. |
| 10,230,335 B2 * | 3/2019 | Rabjohn .................. H03G 3/20 |
| 10,250,199 B2 | 4/2019 | Klaren |
| 10,305,433 B2 | 5/2019 | Ranta et al. |
| 10,374,838 B2 | 8/2019 | Jiang et al. |
| 10,439,562 B2 | 10/2019 | Tokuda et al. |
| 10,439,563 B2 | 10/2019 | Takagi et al. |
| 10,483,929 B2 | 11/2019 | Ranta et al. |
| 10,819,290 B2 | 10/2020 | Ranta et al. |
| 10,873,308 B2 | 12/2020 | Ranta et al. |
| 11,451,205 B2 | 9/2022 | Ranta et al. |
| 2002/0074499 A1 | 6/2002 | Butler |
| 2003/0137355 A1 | 7/2003 | Lin |
| 2005/0029453 A1 | 2/2005 | Allen et al. |
| 2006/0098271 A1 | 5/2006 | Koller et al. |
| 2006/0223457 A1 | 10/2006 | Rahman |
| 2008/0284519 A1 | 11/2008 | Andrews |
| 2008/0300003 A1 | 12/2008 | Jeck et al. |
| 2009/0258611 A1 | 10/2009 | Nakamura et al. |
| 2011/0227642 A1 | 9/2011 | Toyerby et al. |
| 2011/0279178 A1 | 11/2011 | Outaleb et al. |
| 2011/0298538 A1 | 12/2011 | Andrys et al. |
| 2012/0146730 A1 | 6/2012 | Signoff et al. |
| 2013/0217341 A1 | 8/2013 | Jones et al. |
| 2013/0222075 A1 | 8/2013 | Reedy et al. |
| 2013/0229231 A1 | 9/2013 | Tanaka et al. |
| 2014/0097698 A1 | 4/2014 | Wang et al. |
| 2014/0153461 A1 | 6/2014 | Lorenz et al. |
| 2014/0184335 A1 | 7/2014 | Nobbe et al. |
| 2014/0184336 A1 | 7/2014 | Nobbe et al. |
| 2014/0184337 A1 | 7/2014 | Nobbe et al. |
| 2014/0266458 A1 | 9/2014 | Scott et al. |
| 2014/0266460 A1 | 9/2014 | Nobbe et al. |
| 2015/0035612 A1 | 2/2015 | Maxim et al. |
| 2015/0077185 A1 | 3/2015 | Ding et al. |
| 2015/0077187 A1 | 3/2015 | Lam et al. |
| 2015/0249479 A1 | 9/2015 | Nobbe |
| 2015/0270806 A1 | 9/2015 | Wagh et al. |
| 2015/0326206 A1 | 11/2015 | Nobbe |
| 2015/0326326 A1 | 11/2015 | Nobbe et al. |
| 2017/0194916 A1 | 7/2017 | Whittaker et al. |
| 2018/0083578 A1 | 3/2018 | Klaren et al. |
| 2018/0115287 A1 | 4/2018 | Rabjohn |
| 2018/0262163 A1 | 9/2018 | Tokuda et al. |
| 2018/0262164 A1 | 9/2018 | Ranta et al. |
| 2018/0262166 A1 | 9/2018 | Takagi et al. |
| 2018/0316327 A1 | 11/2018 | Ranta et al. |
| 2019/0007240 A1 | 1/2019 | Jiang et al. |
| 2019/0173433 A1 | 6/2019 | Ranta et al. |
| 2019/0181907 A1 | 6/2019 | Pfann et al. |

(56) References Cited

U.S. PATENT DOCUMENTS

| | | | |
|---|---|---|---|
| 2020/0076391 | A1 | 3/2020 | Ranta et al. |
| 2021/0211110 | A1 | 7/2021 | Ranta et al. |

FOREIGN PATENT DOCUMENTS

| | | |
|---|---|---|
| WO | 2006107614 | 10/2006 |
| WO | 2009108391 | 9/2009 |
| WO | 2012082445 | 6/2012 |
| WO | 2018160771 | 9/2018 |

OTHER PUBLICATIONS

Nguyen, Hieu P., Office Action received from the USPTO dated Feb. 15, 2019 for U.S. Appl. No. 16/025,873, 18 pgs.
Nguyen, Hieu P., Notice of Allowance received from the USPTO dated Jul. 11, 2019 for U.S. Appl. No. 16/025,873, 23 pgs.
Nguyen, Hieu P., Office Action received from the USPTO dated Jan. 30, 2018 for U.S. Appl. No. 15/445,811, 6 pgs.
Nguyen, Hieu P., Notice of Allowance received from the USPTO dated May 23, 2018 for U.S. Appl. No. 15/445,811, 22 pgs.
Ranta, et al., Preliminary Amendment filed in the USPTO dated Oct. 16, 2017 for U.S. Appl. No. 15/445,811, 20 pgs.
Ranta, et al., Response filed in the USPTO dated Feb. 9, 2018 for U.S. Appl. No. 15/445,811, 10 pgs.
Nguyen, Hieu P., Office Action received from the USPTO dated Oct. 12, 2018 for U.S. Appl. No. 15/908,533, 6 pgs.
Nguyen, Hieu P., Office Action received from the USPTO dated Sep. 14, 2018 for U.S. Appl. No. 15/908,354, 19 pgs.
Nguyen, Hieu P., Office Action received from the USPTO dated Sep. 14, 2018 for U.S. Appl. No. 15/908,469, 18 pgs.
Mouanda, Thierry, International Search Report and Written Opinion received from the EPO dated Sep. 21, 2018 for appln. No. PCT/US2018/020332, 21 pgs.
Nguyen, Hieu P., Office Action received from the USPTO dated Jan. 7, 2019 for U.S. Appl. No. 15/908,533, 27 pgs.
Nguyen, Hieu P., Final Office Action received from the USPTO dated Jan. 14, 2019 for U.S. Appl. No. 15/908,469, 17 pgs.
Mouanda, Theirry, Invitation to Restric or to Pay Additional Fees received from the EPO dated Mar. 5, 2019 for appln. No. PCT/US2018/020332, 4 pgs.
Nguyen, Hieu P., Notice of Allowance received from the USPTO dated Apr. 2, 2019 for U.S. Appl. No. 15/908,533, 16 pgs.
Mouanda, Thierry, Written Opinion received from the EPO dated May 15, 2019 for appln. No. PCT/US2018/020332, 8 pgs.
Nguyen, Hieu P., Notice of Allowance received from the USPTO dated May 30, 2019 for U.S. Appl. No. 15/908,354, 29 pgs.
Nguyen, Hieu P., Notice of Allowance received from the USPTO dated Jun. 7, 2019 for U.S. Appl. No. 15/908,469, 14 pgs.
PSemi Corporation, Response filed in the USPTO dated Nov. 27, 2018 for U.S. Appl. No. 16/025,873, 5 pgs.
PSemi Corporation, Response filed in the USPTO dated May 15, 2019 for U.S. Appl. No. 16/025,873, 5 pgs.
PSemi Corporation, Amendment After Allowance filed in the USPTO dated Aug. 14, 2019 for U.S. Appl. No. 16/025,873, 5 pgs.
Gundlach, Susanne, Invitation to Pay Additional Fees and, Where Applicable, Protest Fee received from the EPO dated Jun. 15, 2018 for appln. No. PCT/US2018/020332, 13 pgs.

Nguyen, Lee, Notice of Allowance received from the USPTO dated Jul. 31, 2017 for U.S. Appl. No. 14/272,415, 13 pgs.
Wagh, et al., "Gate Drivers for Stacked Transistor Amplifiers", patent application filed Sep. 16, 2016, U.S. Appl. No. 15/268,275, 57 pgs.
Wagh, et al., "Standby Voltage Condition for Fast RF Amplifier Bias Recovery", patent application filed Sep. 16, 2016, U.S. Appl. No. 15/268,297, 53 pgs.
Willard, et al., "Body Tie Optimization for Stacked Transistor Amplifier", patent application filed Sep. 16, 2016, U.S. Appl. No. 15/268,257, 42 pgs.
Nobbe, Dan, "Cascode Amplifier Bias Circuits", Application filed in the USPTO dated Sep. 16, 2016, U.S. Appl. No. 15/268,229, 62 pgs.
Nguyen, Patricia T., Office Action received from the USPTO dated May 3, 2018 for U.S. Appl. No. 15/268,229, 34 pgs.
Tokuda, et al., "Current Mirror Bias Compensation Circuit", application filed in the USPTO on Feb. 28, 2018, U.S. Appl. No. 15/908,354, 86 pgs.
PSemi Corporation, Preliminary Amendment filed in the USPTO on May 29, 2018 for U.S. Appl. No. 15/908,354, 7 pgs.
Takagi, et al., "Positive Temperature Coefficient Bias Compensation Circuit", application filed in the USPTO on Feb. 28, 2018, U.S. Appl. No. 15/908,469, 85 pgs.
PSemi Corporation, Preliminary Amendment filed in the USPTO on May 29, 2018 for U.S. Appl. No. 15/908,469, 6 pgs.
Nguyen, Hieu P., Office Action received from the USPTO dated Nov. 6, 2019 for U.S. Appl. No. 16/253,115, 6 pgs.
Nguyen, Hieu P., Office Action received from the USPTO dated Mar. 9, 2020 for U.S. Appl. No. 16/253,115, 28 pgs.
Nguyen, Patricia T., Office Action received from the USPTO dated Dec. 11, 2017 for U.S. Appl. No. 15/268,229, 6 pgs.
Klaren, et al., Preliminary Amendment filed in the USPTO dated Nov. 29, 2016 for U.S. Appl. No. 15/268,229, 11 pgs.
Klaren, et al., Response filed in the USPTO dated Jan. 29, 2018 for U.S. Appl. No. 15/268,229, 7 pgs.
Klaren, et al., Response filed in the USPTO dated Jul. 17, 2018 for U.S. Appl. No. 15/268,229, 10 pgs.
Wienema, David, International Search Report and Written Opinion received from the EPO dated Aug. 31, 2017 for appln. No. PCT/US2017/044015, 19 pgs.
Ranta, et al., "Power Amplifier Self-Heating Compensation Circuit", application filed in the USPTO dated Feb. 28, 2018, U.S. Appl. No. 15/908,533, 76 pgs.
Curtis, Sean M., Applicant-Initiated Interview Summary received from the USPTO dated Apr. 20, 2020 for U.S. Appl. No. 16/206,828, 3 pgs.
Curtis, Sean M., Notice of Allowance received from the USPTO dated Apr. 30, 2020 for U.S. Appl. No. 16/206,828, 13 pgs.
Liu, et al., English translation of Office Action received from the CNIPA dated Mar. 1, 2023 for appln. No. 201880014279.5, 14 pgs.
Nguyen, Hieu P., Notice of Allowance received from the USPTO dated Aug. 10, 2020 for U.S. Appl. No. 16/253,115, 15 pgs.
Nguyen, Hieu P., Office Action received from the USPTO dated Mar. 25, 2020 for U.S. Appl. No. 16/676,219, 22 pgs.
Nguyen, Hieu P., Notice of Allowance received from the USPTO dated Aug. 14, 2020 for U.S. Appl. No. 16/676,219, 15 pgs.
PSemi Corporation, Response filed in the USPTO on Jun. 5, 2021 for U.S. Appl. No. 16/676,219, 8 pgs.
Nguyen, Hieu P., Office Action received from the USPTO dated Jan. 12, 2022 for U.S. Appl. No. 17/124,118, 27 pgs.
Nguyen, Hieu P., Notice of Allowance received from the USPTO dated May 17, 2022 for U.S. Appl. No. 17/124,118, 8 pgs.

* cited by examiner

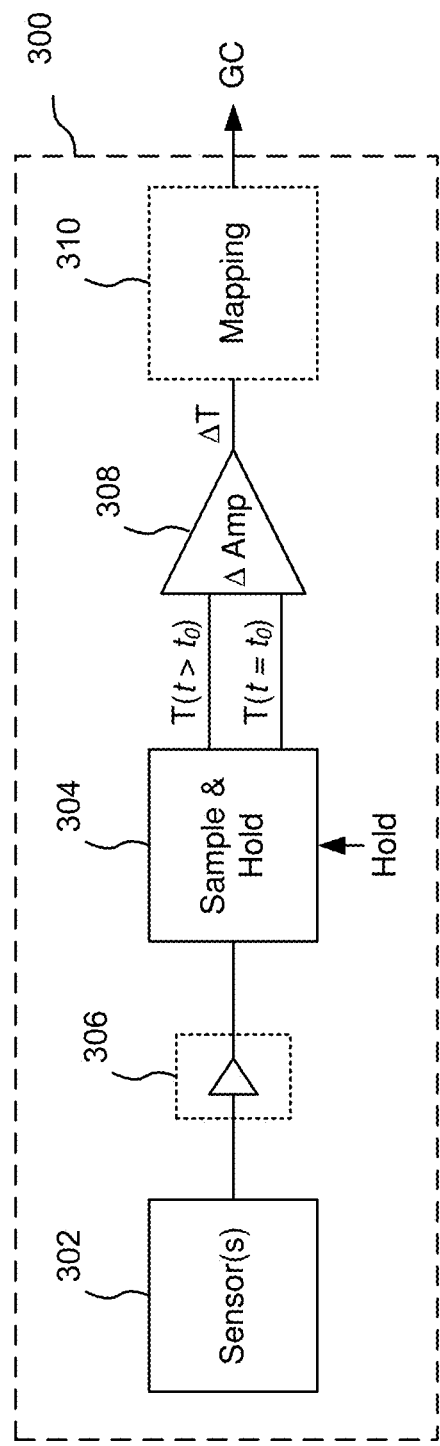
FIG. 3
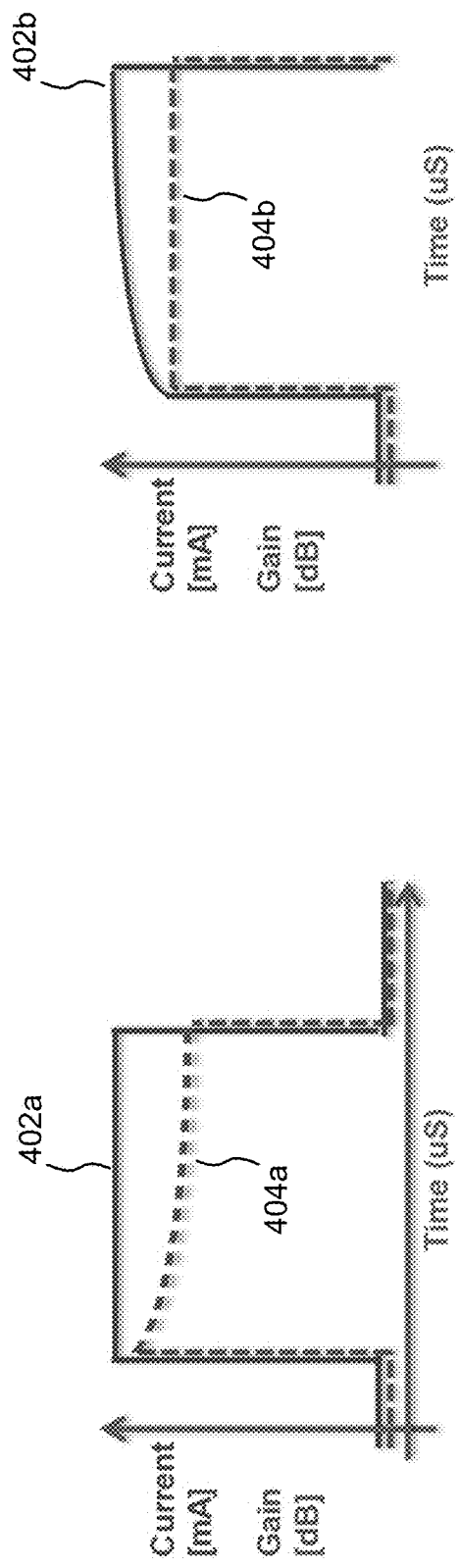
FIG. 4A (Prior Art)
FIG. 4B

*1230*

```
┌─────────────────────────────────────────┐
│ Monitoring a circuit parameter of one of the │
│ target circuit or a scaled replica of the target │
│ circuit, where the circuit parameter varies as a │ ─── 1232
│ function of self-heating of the target circuit │
│ during pulsed operation of the target circuit │
└─────────────────────────────────────────┘
                    ↓
┌─────────────────────────────────────────┐
│ Adjusting one or more circuit parameters of the │
│ target circuit sufficient to substantially offset the │ ─── 1234
│ effect of self-heating of the target circuit on the │
│ circuit parameter during pulsed operation │
└─────────────────────────────────────────┘
```

```
┌─────────────────────────────────────┐
│ Providing at least one scaled replica amplifier in
│ close proximity to the power amplifier, each
│ scaled replica amplifier having an input coupled
│ to a reference signal and outputting an
│ amplified reference signal, wherein each scaled      ⟋— 1242
│ replica amplifier has a corresponding Gain that
│ droops due to self-heating of the power
│ amplifier during pulsed operation of the power
│ amplifier
└─────────────────────────────────────┘
                    ↓
┌─────────────────────────────────────┐
│ Providing a power measurement and correction
│ circuit coupled to the reference signal and to
│ the amplified reference signal, for determining a
│ correction signal as a function of the reference
│ signal and of the amplified reference signal, the
│ correction signal being coupled to the power         ⟋— 1244
│ amplifier to adjust the Gain of the power
│ amplifier sufficient to substantially offset the
│ effect of self-heating of the power amplifier on
│ the Gain of the power amplifier during pulsed
│ operation of the power amplifier
└─────────────────────────────────────┘
```

FIG. 12E

POWER AMPLIFIER SELF-HEATING COMPENSATION CIRCUIT

CROSS-REFERENCE TO RELATED APPLICATIONS—CLAIM OF PRIORITY

This application is a continuation of, and claims the benefit of priority under 35 USC § 120 of, commonly assigned and prior U.S. application Ser. No. 17/124,118, filed Dec. 16, 2020, entitled "Power Amplifier Self-Heating Compensation Circuit", to issue on Sep. 20, 2022 as U.S. Pat. No. 11,451,205, the disclosure of which is incorporated herein by reference in its entirety. Application Ser. No. 17/124,118 is a continuation of, and claims the benefit of priority under 35 USC § 120 of, commonly assigned prior U.S. application Ser. No. 16/676,219, filed Nov. 6, 2019, entitled "Power Amplifier Self-Heating Compensation Circuit", now U.S. Pat. No. 10,873,308, issued Dec. 22, 2020, the disclosure of which is incorporated herein by reference in its entirety. Application Ser. No. 16/676,219 is a continuation of, and claims the benefit of priority under 35 USC § 120 of, commonly assigned prior U.S. application Ser. No. 16/025,873, filed Jul. 2, 2018, entitled "Power Amplifier Self-Heating Compensation Circuit", now U.S. Pat. No. 10,483,929, issued Nov. 19, 2019, the disclosure of which is incorporated herein by reference in its entirety. Application Ser. No. 16/025,873 is a continuation of, and claims the benefit of priority under 35 USC § 120 of, commonly assigned and prior U.S. application Ser. No. 15/445,811, filed Feb. 28, 2017, entitled "Power Amplifier Self-Heating Compensation Circuit", now U.S. Pat. No. 10,056,874, issued Aug. 21, 2018, the disclosure of which is incorporated herein by reference in its entirety. Application Ser. No. 15/445,811 may be related to U.S. patent application Ser. No. 14/272,415, filed May 7, 2014, entitled "Mismatch Detection Using Replica Circuit", and U.S. patent application Ser. No. 15/268,229, filed Sep. 16, 2016, entitled "Cascode Amplifier Bias Circuits", now U.S. Pat. No. 10,250,199, issued Apr. 2, 2019, all of which are assigned to the assignee of the present invention, the entire contents of each of which are incorporated herein by reference.

BACKGROUND

(1) Technical Field

This invention relates to electronic circuitry, and more particularly to electronic power amplifier circuits.

(2) Background

Power amplifiers (PAs) are used in a multitude of electronic systems, particularly radio frequency (RF) systems, such as radios, cellular telephones, WiFi, etc. In a number of radio systems, communication of RF signals is based on time division duplexing (TDD), in which multiple radio transceivers utilize designated time slots within a frequency band to transmit or receive signals. When transmitting a signal in such systems, an RF transceiver PA is operated in a pulsed mode, amplifying an applied RF signal only during each designated time slot, and being powered OFF at other times.

FIG. 1 is a block diagram of a typical prior art radio transmitter two-stage power amplifier 100. In the illustrated example, an integrated circuit (IC) 102 includes several subcircuits that accept an RF input signal RFin and generate an amplified output signal RFout to a selected destination (e.g., one or more band filters and/or antenna ports); the IC 102 may also be referred to as a "chip" or "die".

In the illustrated example, an input impedance matching network (IMN) 104 impedance matches the input signal RFin to a first amplifier stage 106 (often called a driver). An interstage IMN 108 couples the output of the first amplifier stage 106 to a second amplifier stage 110 (in this case, a final stage). The amplified RF output of the second amplifier stage 110 is coupled to an output IMN 112, the output of which is RFout. The PA 100 example shown in FIG. 1 has two amplifier stages, but other embodiments may have fewer or more than two amplifier stages. One or more of the various IMN circuits 104, 108, 112 may be implemented in a tunable configuration, such as by using tunable inductors and/or tunable capacitors; some of the IMN circuits may be optional for some embodiments; and in some embodiments, one or more of the IMN circuits may be off-chip circuits.

In the illustrated example, the first amplifier stage 106 and the final amplifier stage 110 each have corresponding bias circuits 114, 116 for controlling the gain of their respective amplifier stages. A voltage supply $V_{DD}$ 118 provides power as needed to specific circuitry in the IC 102, and may be variable as a function of a control parameter to regulate the behavior of the PA 100. The voltage supply $V_{DD}$ may be provided from off-chip or may be generated on-chip from an external power source; an off-chip configuration is shown by way of example.

In operation in a TDD based radio system, such as WiFi system, a PA 100 will be powered ON in response to a supplied control signal (not shown) and amplify a transmission signal for a period of time, and then be powered OFF by the supplied control signal. FIG. 2 is a graph of an example ideal RFout pulse 200 from a TDD PA 100, and of an example realistic RFout pulse 202 from a TDD PA showing output power (Gain) as a function of time. As shown, the illustrated ideal pulse 200 ideally has a square wave-form over a 4 mS operational interval (such an interval corresponds to a "long packet" in a WiFi system). However, in actual pulsed PA circuits, self-heating of the PA generally causes Gain to "droop"—that is, as the PA circuit warms up due to current flow through the first and second amplifier stages 106, 110, Gain decreases over time. Self-heating of the PA 100 causes its Gain to droop by more than about 0.2 dB in 4 mS, as shown by the realistic pulse 202.

Some advanced RF systems have a specification that requires that Gain not droop more than a specified amount. For example, systems conforming to the WiFi 802.11ac standard may not exhibit more than 0.17 dB of PA Gain droop, and systems conforming to the WiFi 802.11ax standard may not exhibit more than 0.10 dB of PA Gain droop. The inability to maintain a flat enough Gain over time for pulses means that corresponding error vector magnitude (EVM) specifications cannot be met as well. Some attempts have been made to continuously monitor the ambient temperature of an IC and adjust the gain of a PA amplifier stage accordingly. However, by not responding only to self-heating during pulsed operation, such an approach causes too much bias current variation as ambient temperature varies, resulting in poor linearity performance due to under or over-biasing the PA across a full ambient temperature range.

Accordingly, there is a need for a circuit and method for controlling a power amplifier circuit to maintain approximately constant Gain versus time during pulsed operation sufficient to substantially offset self-heating of the power amplifier. The present invention meets this need.

SUMMARY OF THE INVENTION

The invention encompasses temperature compensation circuits that adjust one or more circuit parameters of a power amplifier (PA) to maintain approximately constant Gain versus time during pulsed operation sufficient to substantially offset self-heating of the PA. Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 3 is a block diagram of a generalized circuit for generating a Gain Control (GC) signal suitable for adjusting one or more circuit parameters of a PA as a function of direct temperature measurement to maintain approximately constant Gain versus time during pulsed operation sufficient to substantially offset self-heating of the PA.

FIG. 4A is a graph of PA Bias Current and Gain versus time for an amplification pulse of a conventional PA.

FIG. 4B is a graph of PA Bias Current and Gain versus time for an amplification pulse of a PA in which the Bias Current is augmented and varied by a GC signal generated by the GC signal circuit of FIG. 3.

FIG. 12D is a process flow diagram of a method for temperature compensating a target circuit.

FIG. 12E is a process flow diagram of a method for temperature compensating an integrated circuit including (1) a power amplifier having a corresponding Gain that droops due to self-heating of the power amplifier during pulsed operation and (2) a temperature compensation circuit.

Like reference numbers and designations in the various drawings indicate like elements.

DETAILED DESCRIPTION OF THE INVENTION

Overview

Figure 1:
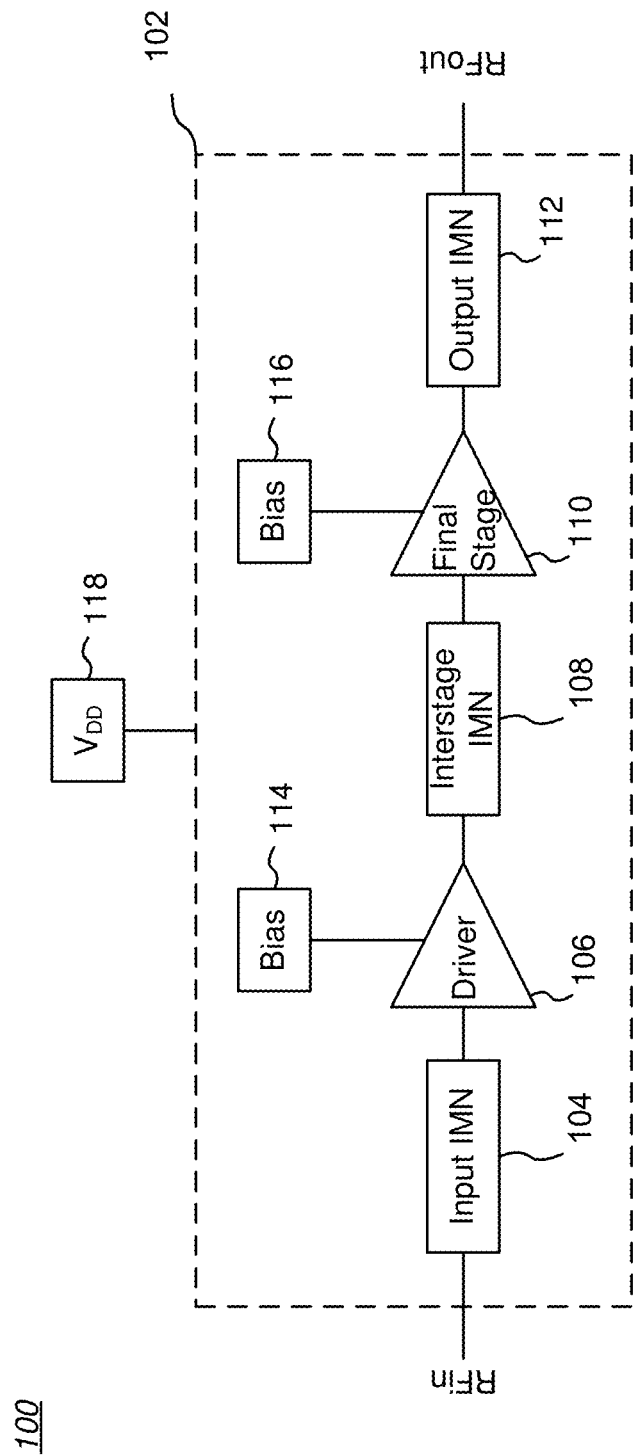
FIG. 1 is a block diagram of a typical prior art radio transmitter two-stage power amplifier.
Figure 2:
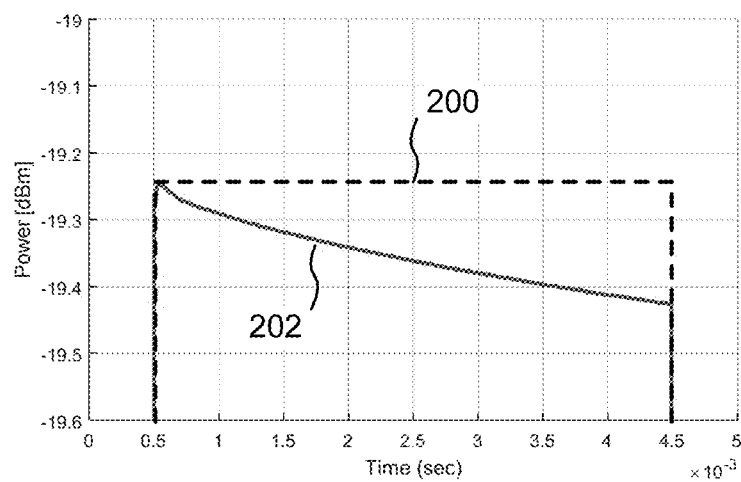
FIG. 2 is a graph of an example ideal RFout pulse from a TDD PA, and of an example realistic RFout pulse from a TDD PA, showing output power (Gain) as a function of time.

The invention encompasses temperature compensation circuits that adjust one or more circuit parameters of a power amplifier (PA) to maintain approximately constant Gain versus time during pulsed operation sufficient to substantially offset self-heating of the PA. Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

While aspects of the invention are described in the context of power amplifiers operated in a pulsed mode, the temperature compensation circuits encompassed by the invention are also generally applicable to target circuits having performance parameters affected by temperature and for which a flat response is desired, so long as such circuits have some adjustable parameter which allows compensating adjustment of the response.

Direct Temperature Measurement Gain Control Signal Generation

FIG. 3 is a block diagram of a generalized circuit 300 for generating a Gain Control (GC) signal suitable for adjusting one or more circuit parameters of a PA as a function of direct temperature measurement to maintain approximately constant Gain versus time during pulsed operation sufficient to substantially offset self-heating of the PA. The GC signal circuit 300 may be fabricated as part of an IC that includes a PA, but in some applications one or more components of the GC signal circuit 300 may be external to such an IC. In many applications, it may be desirable to have one GC signal circuit 300 per PA amplifier stage.

One or more temperature sensors 302 capable of measuring the temperature of a PA or of a circuit that closely follows the temperature of a PA (e.g., a small-scale replica of a PA) are coupled to a sample-and-hold (S&H) circuit 304, optionally through an amplifier or buffer 306. Each temperature sensor 302 may include, for example, a PN junction diode, a diode-connected field effect transistor (FET), a resistor, a proportional-to-absolute temperature (PTAT) circuit, a digital temperature sensor, etc. In many applications, it is desirable for the temperature sensors 302 to have a fast response time to changes in temperature (i.e., high thermal diffusivity).

An important characteristic of the S&H circuit 304 is that it be able to capture (sample and hold) a signal from the temperature sensors 302 representing the temperature T of an associated PA at an initial time point $t=t_0$ and provide that held (fixed) signal, $T(t=t_0)$, as a first output. Thereafter, the S&H circuit 304 generates a continuous measurement that corresponds to the temperature T of the PA during the remainder of the pulse (i.e., for times $t>t_0$) and provides that variable signal, $T(t>t_0)$, as a second output. The initial time point $t_0$ is controlled by a Hold control signal normally set to be applied to the S&H circuit 304 shortly after (e.g., 5-10 μS) the commencement of an operational pulse within the PA. Delayed capture of $T(t=t_0)$ allows the PA to reach its peak gain and/or a desired initial operating condition after pulse commencement.

The two outputs of the S&H circuit 304, $T(t=t_0)$ and $T(t>t_0)$, are coupled to respective inputs of a differential amplifier 308. The differential amplifier 308 may be, for example, a differential transconductance amplifier that turns a voltage difference between two input terminals into a current at an output terminal. However, other circuits may be used that can generate an output that is a function of the difference between two provided inputs.

The differential amplifier 308 generates an output signal ΔT that represents the difference between the initial temperature $T(t=t_0)$ and the subsequently measured PA operating temperature $T(t>t_0)$ as the PA self-heats for the duration of the pulse. The output signal ΔT from the differential amplifier 308 may be applied to a correction circuit, such as an optional mapping circuit 310 that maps or associates ΔT signal values to control signal values (e.g., voltage or current levels) to output a Gain Control (GC) signal that is a function of the difference between the initial temperature and the subsequently measured PA operating temperature as the PA self-heats for the duration of the pulse.

In some applications, the ΔT output signal of the differential amplifier 308 may be essentially used directly as the GC signal (e.g., where the "mapping" of the ΔT output signal to GC signal is linear and properly proportionate). In other applications, the "mapping" of the ΔT output signal to GC signal may apply an offset linear function, an inverse function, or a non-linear function (e.g., a logarithmic function). In any case, the mapping function may be programmable. Programming such a mapping function for an IC embodying GC signal circuit 300 may be performed once, such as during fabrication or in the field (e.g., by burning or "blowing" fusible links). Alternatively, such programming may vary as a function of programmed input to the IC from an external source, and/or as a function of IC state or status. In some embodiments, the ΔT output signal of the differential amplifier 308 may be digitized (e.g., through an analog-to-digital converter, or ADC) and applied to a look-up table (LUT) programmed with a desired mapping function in order to generate a GC signal; the GC signal output from the LUT may be used directly for digitally adjustable components, or converted back into a voltage or current signal for application to analog circuitry.

Because the GC signal circuit 300 measures an initial temperature $T(t=t_0)$ of a PA and compares that temperature to subsequently measured values of PA operating temperature $T(t>t_0)$, the GC signal is a function of PA self-heating during pulsed operation, regardless of other contributors to temperature inside and/or outside of an IC.

Application of GC Signal

The output GC signal generated by the GC signal circuit 300 may be used to offset the Gain droop of a PA as the PA self-heats for the duration of a pulse. A variety of circuit parameters can be adjusted to achieve such an offset. For example, FIG. 4A is a graph of PA Bias Current 402a and Gain 404a versus time for an amplification pulse of a conventional PA. While the PA Bias Current 402a rises quickly and is then essentially flat for the pulse duration, the corresponding PA Gain 404a exhibits droop over time due to self-heating of the PA.

In contrast, FIG. 4B is a graph of PA Bias Current 402b and Gain 404b versus time for an amplification pulse of a PA in which the Bias Current 402b is augmented and varied by a GC signal generated by the GC signal circuit 300 of FIG. 3. For example, the GC signal may be a current summed with the normal Bias Current applied to a PA. In the illustrated example, PA Bias Current 402b rises quickly and is then adjusted even higher by the GC signal as a function of PA self-heating temperature rise during the pulse duration. The increased Bias Current 402b to the PA increases the Gain of the PA. Accordingly, the droop in Gain of the PA that would otherwise occur due to self-heating is substantially offset by a nearly mirror-image of the drooping Gain curve 404a of FIG. 4A, leading to an essentially flat PA Gain 404b for the duration of the pulse.

Figure 5:
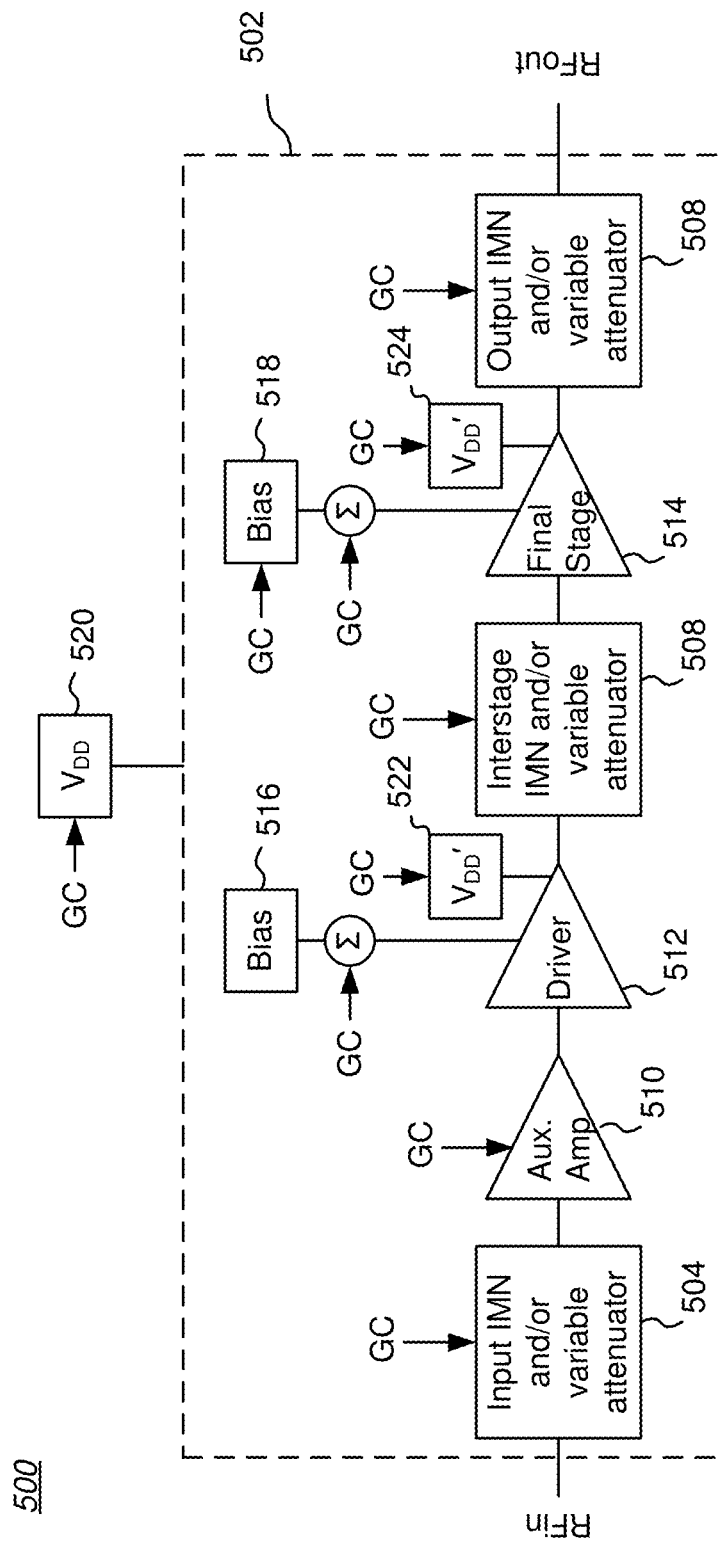
FIG. 5 is a block diagram of a PA on an integrated circuit having multiple components whose parameters may be adjusted to offset self-heating Gain droop of the PA under control of the GA signal from the circuit of FIG. 3.

More generally, the output GC signal generated by the GC signal circuit 300 may be used to offset the self-heating Gain droop of a PA by varying any PA circuit parameter or set of parameters that controls the effective Gain of the PA output at RFout so as to essentially flatten the effective Gain. Such circuit parameters include output power, voltage, current, and/or RF signal amplitude. For example, FIG. 5 is a block diagram of a PA 500 on an integrated circuit 502 having multiple components whose parameters may be adjusted to offset self-heating Gain droop of the PA under control of the GA signal from the circuit of FIG. 3.

In the illustrated example, an input IMN and/or variable attenuator circuit 504 may be controlled by a coupled GC signal so as to vary the matching characteristics of the circuit and/or the RF signal path attenuation level in order to offset the PA Gain droop. For example, a digital step attenuator (DSA) or variable analog attenuator may be configured to always provide a nominal level of signal amplitude attenuation, which may be adjusted downward by the GC signal (converted if necessary to digital form through an ADC) to reduce RF signal attenuation from RFin to RFout, thus compensating for PA Gain droop by increasing the amplitude of the RF signal. A similar approach may be used for an intermediate IMN and/or variable attenuator circuit 506, and/or for an output IMN and/or variable attenuator circuit 508.

As another example, an auxiliary amplifier 510, such as a variable gain amplifier (VGA), may be placed in the RF signal path between RFin and RFout to provide additional signal amplification (Gain) in response to the GC signal, thus compensating for PA Gain droop.

Looking at the first amplifier (driver) stage 512 and the second amplifier (final) stage 514 of the example PA 500, a GC signal may be combined with the output of their respective bias circuits 516, 518 to boost the bias level of one or both amplifier stages (that is, in some applications, only one amplifier stage 512, 514 need be compensated in order to offset the self-heating PA droop of all amplifier stages). For example, an analog current representing the GC signal may be summed with the normal bias current applied to one or both amplifier stages. Alternatively, a GC signal may be applied to the respective bias circuits 516, 518 to internally adjust the bias level supplied to one or both amplifier stages. Further details regarding biasing of a PA are disclosed in U.S. patent application Ser. No. 14/272,415, filed May 7, 2014, entitled "Mismatch Detection Using Replica Circuit", and in U.S. patent application Ser. No. 15/268,229, filed Sep. 16, 2016, entitled "Cascode Amplifier Bias Circuits", both of which are assigned to the assignee of the present invention, and the contents of which are hereby incorporated by reference.

As another example, the voltage supply $V_{DD}$ 520 to the IC 502 may be varied (e.g., boosted) as a function of the GC signal to compensate for self-heating PA droop. Alternatively, the voltage (and/or current) supplied only to specific components of the PA may be varied as a function of the GC signal to compensate for self-heating PA droop. For example, drain voltage sources $V_{DD}'$ 522, 524 may be derived from $V_{DD}$ 520 and applied to the "top" of a corresponding stack of N FETs comprising each amplifier stage 512, 514 (N is typically between 3 and 5). The drain voltage sources $V_{DD}'$ 522, 524 may be varied by the GC signal to adjust the effective Gain of the stage. As one example, the drain voltages sources $V_{DD}'$ 522, 524 may be derived from $V_{DD}$ 520 by placing a low drop-out (LDO) voltage regulator between $V_{DD}$ and the drain of a stack of FETs comprising a PA stage. Increasing the output voltage of the LDO would increase the Gain of the FET stack. Accordingly, to compensate for Gain droop, the LDO output voltage could initially be set to a relatively low value, and then increased to maintain an essentially constant Gain.

Another alternative is to adjust the gate bias voltages to one or more of the N FETs in an amplifier stage stack to change the drain voltage on the "bottom" FET in the stack, thereby adjusting its gain. This approach does not require any additional power supply, but merely redistributes the available $V_{DD}$ across the FETs in the stack to achieve a desired gain adjustment.

As noted above, in many applications, it may be desirable to have one GC signal circuit 300 per PA amplifier stage. However, as should be clear from the above disclosure, the GC signal from one GC signal circuit 300 may be used to adjust the effective Gain of the PA as a whole during an operational pulse by adjusting only one or a subset of the PA components. Accordingly, it is not necessary that the GC signal from a GC signal circuit 300 associated with a PA amplifier stage be used to adjust only parameters of the associated stage to offset self-heating PA droop. For example, if separate GC signal circuits are associated with a PA driver stage and a PA final stage, and the resulting GC signals are used to control the bias applied to at least one stage, then at least the following configurations are possible:

| Stage for which ΔT is measured to generate GC signal | Stage for which bias is adjusted in response to generated GC signal |
| --- | --- |
| Driver | Driver |
| Final | Final |
| Final | Driver |
| Driver | Final |
| Final | Driver & Final |
| Driver | Driver & Final |

Example Analog Sample and Hold Circuit

Figure 6A:
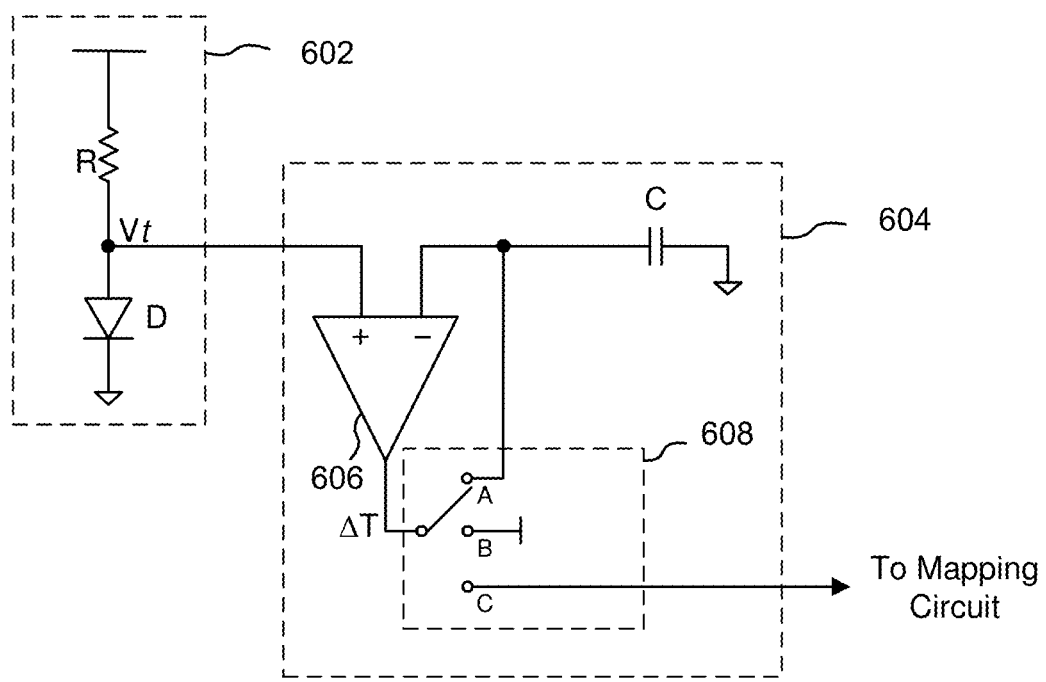
FIG. 6A is a schematic diagram of one embodiment of an analog temperature sensor and S&H circuit that may be used in the circuit of FIG. 3.

FIG. 6A is a schematic diagram of one embodiment of an analog temperature sensor 602 and S&H circuit 604 that may be used in the circuit of FIG. 3. The temperature sensor 602 includes a series-coupled resistor R and diode D coupled between a voltage supply and circuit ground. If the diode D is fabricated in reasonably close proximity to an amplifier stage of a PA, the node between the resistor R and diode D will have a voltage Vt that varies as a function of the temperature of the amplifier stage (see further disclosure below regarding placement of temperature sensor circuits). As should be clear, a different temperature sensing circuit could be used in place of the diode-based temperature sensor 602; examples are given above.

The voltage Vt is coupled to a first input of a differential amplifier 606 which may be, for example, a differential transconductance amplifier (however, as noted above, other circuits may be used that can generate an output that is a function of the difference between two provided inputs). The output of the differential amplifier 606 is coupled to a 3-terminal switch 608 that may be implemented with field effect transistors (FETs). Terminal A of the switch 608 is coupled to a charge storage capacitor C and to a second input of the differential amplifier 606. Terminal B is an open circuit, and terminal C is coupled to a mapping circuit as in FIG. 3, or is directly used as a GC signal.

Figure 6B:
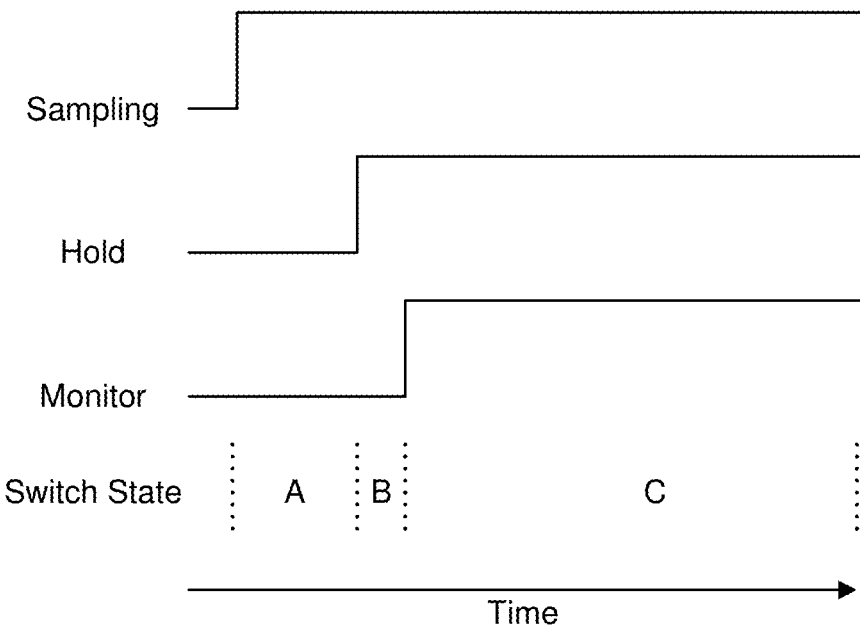
FIG. 6B is a timing diagram showing one example of the control signals for the A, B, and C terminals of the switch of FIG. 6A.

The state of the switch 608 is set by control signals essentially derived from the supplied control signal, PA_en, that powers the PA ON and OFF, defining a pulse. FIG. 6B is a timing diagram showing one example of the control signals for the A, B, and C terminals of the switch 608 of FIG. 6A.

When the PA is powered ON (enabled) by its control signal PA_en (not shown), the temperature sensor 602 and S&H circuit 604 are also powered ON; alternatively, the temperature sensor 602 and S&H circuit 604 may always be ON, but be initialized at the rising edge of $PA_{EN}$ signal. In either case, concurrently with the assertion of an "enabled" state by the control signal PA_en (or after a desired delay), a Sampling signal is generated and applied to the switch 608 to couple the output of the differential amplifier 606 to terminal A as an initial state. As a consequence, capacitor C will be charged up until both inputs to the differential amplifier 606 are equal to Vt, the voltage representing the momentary temperature of an associated amplifier stage of a PA. More precisely, for the case where the differential amplifier 606 is a transconductance amplifier, the voltage on the positive input will be Vt, but the voltage on the negative input (and on capacitor C) will be the combination of Vt and the inverse of the cumulative offsets (imbalances) in the differential amplifier 606 required to set its output current to zero (once the voltage on capacitor C settles to a static value, no current can flow). Accordingly, the S&H circuit 604 in effect calibrates out all of its offsets during the Sampling phase, and capacitor C is in essence constantly tracking the temperature of the associated PA.

After a short delay (e.g., about 5-10 μS), a Hold signal is generated and applied to the switch 608 to couple the output of the differential amplifier 606 to terminal B and thus uncouple the capacitor C from any further input from the differential amplifier 606; the transition to terminal B provides a non-overlapping switching sequence to reduce sampling errors. The Hold signal may be a delayed version of the Sampling signal (the circuits for delaying timing signals are conventional and thus not shown). At the moment of assertion of the Hold signal, $t_0$, the capacitor C has a charge that represents the temperature $T(t=t_0)$ of the associated PA amplifier stage (as well as any associated S&H circuit 604 offsets, so as to effectively dynamically calibrate out such offsets as noted above). Thus, coupling the output of the differential amplifier 606 to terminal B for a brief (e.g., 0.1-1 μS) transition period allows the circuitry to settle to a new state—thus avoiding transients in the GC signal circuitry—while preserving the sampled charge on capacitor C. For example, the compensation circuit that includes the S&H circuit 604 may generate a gain step when it transitions to the Hold phase, so this should occur before an RF receiver begins to lock in its gain equalization.

Thereafter, a Monitor signal is generated and applied to the switch 608 to couple the output of the differential amplifier 606 to terminal C. The Monitor signal may be a delayed version of the Sampling signal or of the Hold signal. When the S&H circuit 604 is in this configuration, one input of the differential amplifier 606 is the stored charge (voltage) on capacitor C, representing $T(t=t_0)$, while the other input of the differential amplifier 606 is Vt, representing $T(t>t_0)$— that is, the continuously measured temperature of the PA during a pulse. The output of the differential amplifier 606 is ΔT, which represents the difference between the initial temperature $T(t=t_0)$ and the subsequently measured PA operating temperature $T(t>t_0)$ as the PA self-heats for the duration of a pulse.

As should be clear, other analog sample and hold circuits may be used to determine $\Delta T=T(t>t_0)-T(t=t_0)$ during the occurrence of PA pulsed operation.

Example Digital Sample and Hold Circuit

Figure 7:
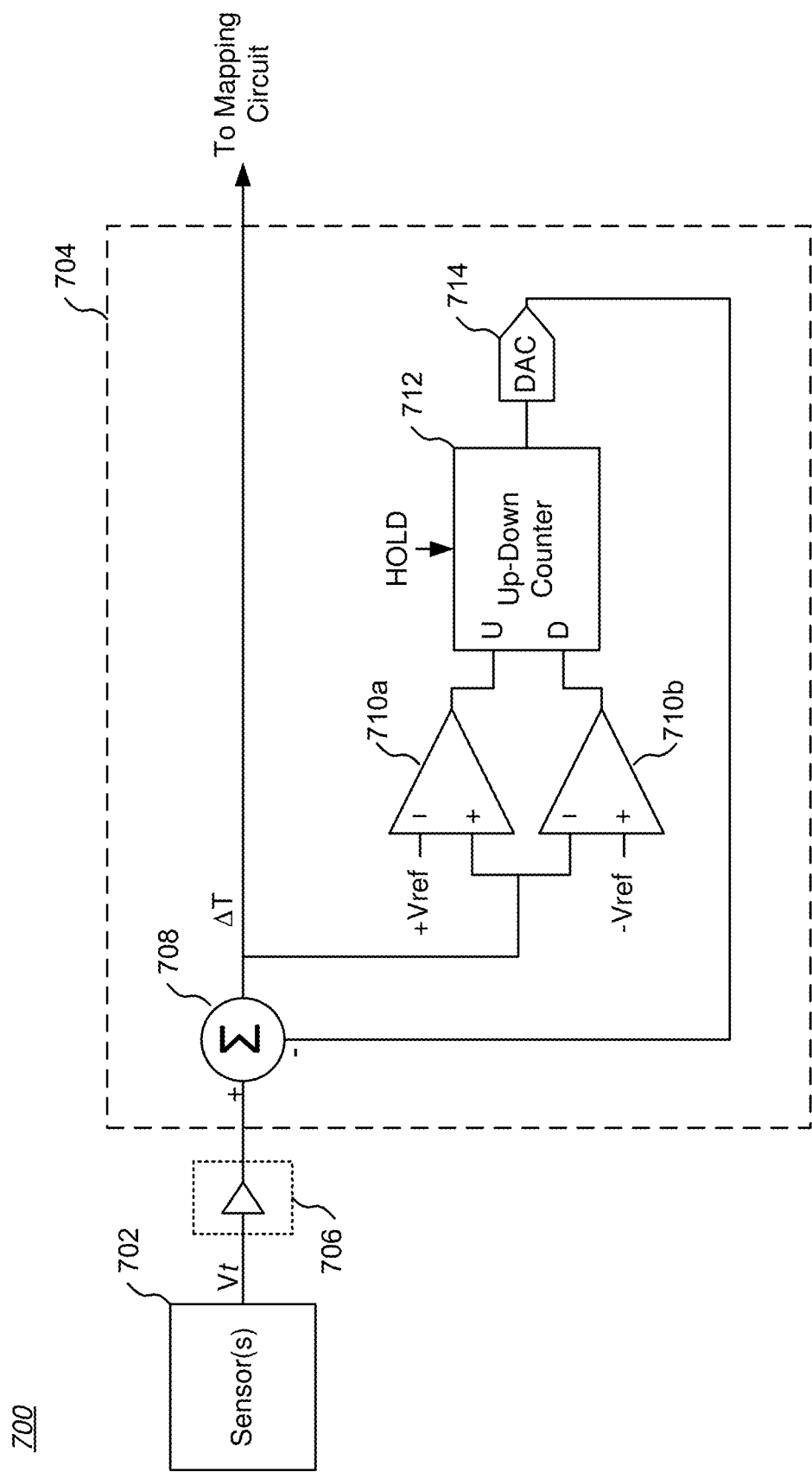
FIG. 7 is a block diagram of one embodiment of a partially digital S&H circuit.

FIG. 7 is a block diagram of one embodiment of a partially digital S&H circuit 700. The output Vt of one or more temperature sensors 702 is coupled to the input of a counter-DAC-based circuit 704, optionally through an amplifier or buffer 706. More specifically, the temperature sensors 702 are coupled to the plus-input of a summing circuit 708 in this example. The output of the summing circuit 708 is coupled to an optional mapping circuit or may be used directly as a GC signal.

The output of the summing circuit 708 is also coupled to opposite polarity inputs of two comparators 710a, 710b. The other inputs of the comparators 710a, 710b are coupled to a associated reference voltages +Vref and −Vref. In the illustrated example, a positive reference voltage +Vref (e.g., +0.5 LSB) is applied to the negative input of comparator 710a, and a negative reference voltage −Vref (e.g., −0.5 LSB) is applied to the positive input of 710b. The outputs of the comparators 710a, 710b are coupled to respective Up and Down inputs of an Up-Down counter 712. The count output of the Up-Down counter 712 is coupled to a DAC 714, the analog output of which is coupled to the minus-input of the summing circuit 708. A HOLD signal controls enablement of the Up-Down counter 712, and may be a delayed version of the PA_en control signal for an associated PA.

In operation, the differential voltage sum from the summing circuit 708 (i.e., plus-voltage less minus-voltage) is applied to the comparators 710a, 710b. While the Up-Down counter 712 is enabled (e.g., the HOLD signal=0), if the sum is greater than +Vref, the Up-Down counter 712 counts UP; conversely, if the sum is less than −Vref, the Up-Down counter 712 counts DOWN. The digital output of the Up-Down counter 712 is converted back to an analog signal by the DAC 714.

When the output of the DAC 714 equals Vt (within a margin of error of ±0.5 LSB) at a moment in time, the output of the Up-Down counter 712 does not change state. If Vt decreases (indicating an increase in temperature of the associated PA when using a sensor having a negative temperature coefficient, such as the diode-based sensor as in FIG. 6A), then the Up-Down counter 712 will count DOWN until the output of the DAC 714 again equals the Vt (within the margin of error). Conversely, if Vt increases (indicating a decrease in temperature of the associated PA when using a sensor having a negative temperature coefficient), then the Up-Down counter 712 will count UP until the output of the DAC 714 again equals the Vt (again, within the margin of error). Accordingly, the output of the DAC 714 represents the continuously tracked temperature of the associated PA while the Up-Down counter 712 is enabled. As should be clear, other temperature sensors may have a positive temperature coefficient (i.e., Vt would increase with increasing temperature and decrease with decreasing temperature); the mapping circuit may be used to account for a sign or function change in the S&H circuit 700.

When the HOLD signal is asserted (e.g., HOLD=1) at time $t_0$, thereby disabling counting in the Up-Down counter 712, the output of the Up-Down counter 712 cannot change. Accordingly, the last count output represents a held value for Vt, which represents $T(t=t_0)$. Since the minus-input to the summing circuit 708 is thereafter constant for the duration of a pulse, and the plus-input to the summing circuit 708 tracks the value of Vt, which represents $T(t>t_0)$, the output of the summing circuit 708 is $\Delta T$. As noted above, $\Delta T$ represents the difference between the initial temperature $T(t=t_0)$ and the subsequently measured PA operating temperature $T(t>t_0)$ as the PA self-heats for the duration of a pulse. The $\Delta T$ value may be used directly as a GC signal or mapped to generate a GC signal as described above.

As should be clear, other digital or partly digital sample and hold circuits may be used to determine $\Delta T = T(t>t_0) - T(t=t_0)$ during the occurrence of PA pulsed operation.

Temperature Difference Measured at Proximate & Distant Locations

In some applications, two or more continuous temperature sensing circuits can be used to isolate measurements of PA self-heating during pulsed operation without using a sample and hold configuration. A first continuous temperature sensing circuit may be located in close proximity to a PA, while a second continuous temperature sensing circuit may be located at a farther distance from the heat-generating components on an IC, particularly the PA amplifier stages, so as to measure general IC temperature while minimizing the influence of heat generated by other circuits on the IC. Examples of such placements are discussed below with respect to FIG. 11.

Instead of holding an initial temperature reading in an S&H circuit, the measurements from the distant continuous temperature sensing circuit would be subtracted from the measurements from the proximate continuous temperature sensing circuit during pulsed operation of the PA associated with the proximate continuous temperature sensing circuit. The resulting difference may be applied to a mapping circuit to generate a Continuous GC signal that reflects essentially only PA self-heating during pulsed operation.

In essence, rather than defining a $\Delta T$ as being the difference between a temperature at an initial time and a temperature at a subsequent time, $\Delta T$ can instead be defined as the difference between a proximate temperature $T(p)$ indicative of self-heating during pulsed operation of a PA, and a distant temperature $T(d)$ reflecting general IC temperature; that is, $\Delta T = T(p) - T(d)$. As should be clear, a variety of circuits may be used to determine $\Delta T$ in this fashion during the occurrence of PA pulsed operation. The resulting difference, $\Delta T$, may then be mapped to a GC signal and the GC signal applied to offset the self-heating of the PA, as described above.

Figure 8:
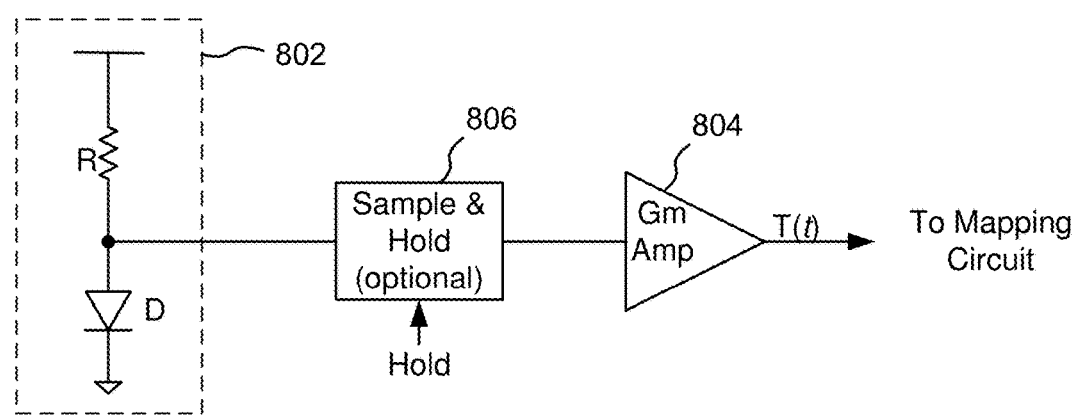
FIG. 8 is a schematic diagram of one embodiment of a continuous temperature compensation circuit.

Suitable continuous temperature sensing circuits may be readily implemented on an IC. For example, FIG. 8 is a schematic diagram of one embodiment of a continuous temperature compensation circuit 800. A temperature sensor 802 includes a series-coupled resistor R and diode D coupled between a voltage supply and circuit ground. The node between the resistor R and diode D will have a voltage Vt that varies as a function of the surrounding temperature. The voltage Vt may be amplified by a transconductance amplifier 804 that turns the voltage applied to its input terminal into a current at its output terminal. The output of the amplifier 804 represents a continuous measurement of temperature over time, T(t), at the location of the temperature sensor 802. As should be clear, other circuits may be used to determine T(t).

In a variation, the continuous temperature sensing circuit 800 used for distant temperature measurements may include an optional S&H circuit 806 so that the measured ambient temperature at the beginning of pulse may be sampled and held near the commencement of pulsed operation, thus "locking" the ambient temperature measurement to an invariant value for the duration of the pulse. The S&H circuit 806 would be controlled by a Hold signal generated by commencement of a pulse (possibly with some delay). Such a configuration would prevent PA self-heating during pulsed operation from influencing the distant temperature sensor.

Continuous Temperature Compensation

Any of the circuits for generating a GC signal described above (or their equivalents) can be used in conjunction with continuous temperature compensation of bias current to one or more stages of a PA. As is known, it is often useful to adjust the Gain of a PA to compensate for ambient temperature, such as the environment in which an IC is used (e.g., embedded within a cellular phone enclosure located in a desert).

For example, a continuous temperature sensing circuit 800 such as shown in FIG. 8 may be located at an appreciable distance from heat-generating components on an IC, particularly the PA amplifier stages, to minimize the influence of heat generated by other circuits on the IC. The output of such a continuous temperature sensing circuit 800 may be applied to a mapping circuit to generate an Ambient GC signal. Whereas the GC signal and Continuous GC signal described above are correlated with the self-heating of an associated PA, an Ambient GC signal is designed to be uncorrelated with such self-heating. In some embodiments, an Ambient GC signal may be summed with the normal Bias Current applied to a PA to compensate for variations in Gain due to changes in ambient temperature. In addition, a GC signal or Continuous GC signal may be summed with the normal Bias Current applied to a PA to compensate for variations in Gain due to PA self-heating during pulsed operation.

Indirect Temperature Measurement

In the embodiments described above, PA self-heating during pulsed operation was directly measured by one or more temperature sensor circuits. In alternative embodiments, PA self-heating during pulsed operation may be inferred (i.e., indirectly measured). For example, instead of measuring PA temperature rise due to self-heating and using the result to adjust Gain, measurement can be made of another circuit parameter of the PA or of a scaled replica of the PA that varies as a function of self-heating of the PA during pulsed operation. The resulting measurement can be used to adjust the effective Gain of the PA, such as by adding an off-setting current to the bias current for one or more amplifier stages of the PA.

Figure 9:
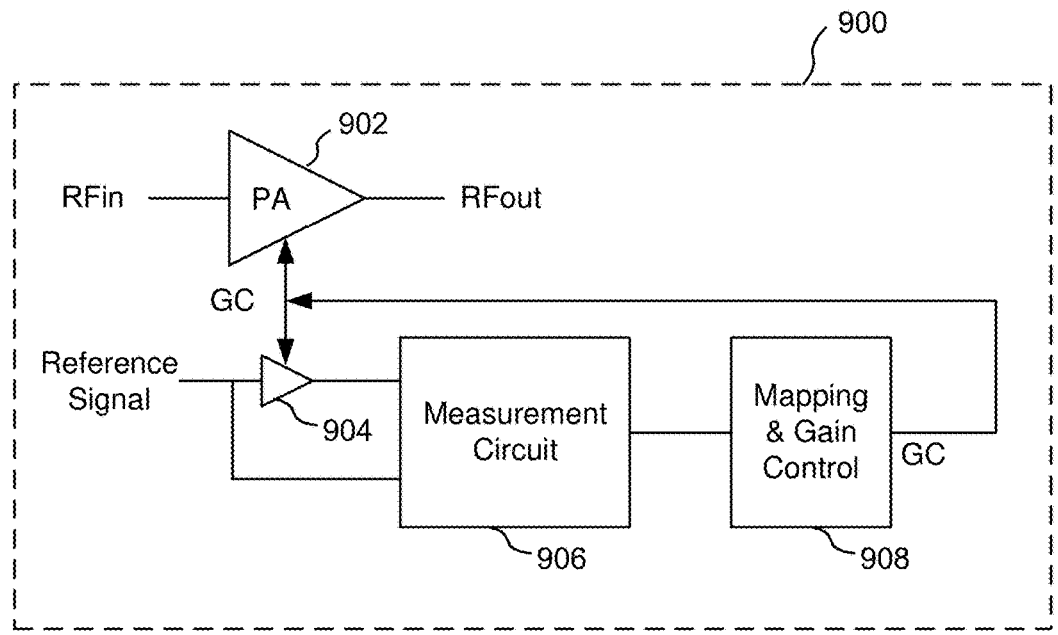
FIG. 9 is a first embodiment of an indirect temperature measurement gain control signal generation circuit.

FIG. 9 is a first embodiment of an indirect temperature measurement gain control signal generation circuit 900. The circuit 900 includes a conventional PA 902 having a Gain control adjustment (e.g., an adjustable bias circuit). Also included is a scaled replica amplifier 904 that, in known fashion, mimics the characteristics and performance behavior of the PA 902, but at a smaller scale (e.g., ⅛ size). The replica amplifier 904 would be fabricated in close proximity to the PA 902 so as to be affected by the self-heating of the PA 902 during pulsed operation. The nominal Gain for the replica amplifier 904 generally would be the same as the nominal Gain for the PA 902 to maximize correlation, but may be set to some other value, such as unity, to simply measurement.

In the illustrated example, a Reference Signal is applied to the input of the replica amplifier 904 and to a first input of a conventional measurement circuit 906, which may, for example, measure a desired parameter, such as Gain, power, voltage, current, etc. When using a replica amplifier 904, the Reference Signal typically would be an RF or AC signal (e.g., 0.5V±10 mV) simply intended to measure the small-signal response of the replica amplifier 904. The output of the replica amplifier 904 is coupled to a second input of the measurement circuit 906, which outputs a signal that represents the difference (e.g., in Gain, power, voltage, current, etc.) between the Reference Signal and the output of the replica amplifier 904.

Since the replica amplifier 904 mimics the behavior of the PA 902 and is located in close proximity to the PA 902, self-heating of the PA 902 during pulsed operation will cause a correlated temperature change in the replica amplifier 904. The change in temperature of the replica amplifier 904 during a pulse will cause the Gain of the replica amplifier 904 to droop. The measurement circuit 906 will output a signal proportional to the amount of droop in comparison to the Reference Signal, which thus represents an indirect, temperature-dependent measurement of the droop occurring in the PA 902 during the pulse. The measurement circuit 906 output may be coupled to a mapping and Gain control circuit 908 that provides a suitable GC signal back to the PA 902 and the replica amplifier 904 to boost their respective Gains in an amount sufficient to substantially offset the droop.

Since the measured parameter of the replica amplifier circuit 904 (e.g., change in Gain) is measured only during pulsed operation of the PA 902 and directly takes into account a characteristic that is a function of self-heating of the PA 902 during pulsed operation, no sample and hold circuitry is required. Alternatively, a S&H circuit (not shown) may be provided (e.g., within or after the measurement circuit 906) to capture a DC representation of the measured parameter of the replica amplifier circuit 904 at to and compare that held value to the instantaneous parameter value of the replica amplifier circuit 904 during pulsed-operation of the PA 902 to determine the amount of Gain droop of the amplifier circuit 904 (and hence of the PA 902, due to its self-heating during pulsed operation). The difference between the two measured values would be applied to the mapping and Gain control circuit 908 to generate a suitable GC signal back to the PA 902 and the replica amplifier 904 to boost their respective Gains in an amount sufficient to substantially offset the droop. The sample-and-hold configuration can be used continuously or as a sampled system. The benefit of using a sampled version is that the adjustment range is minimized (e.g., Δ10° C. instead of, for example, −40° C. to +85° C., which is a difference of 125° C.).

Further details regarding the use of replica circuits in conjunction with a PA are disclosed in U.S. patent application Ser. No. 14/272,415, filed May 7, 2014, entitled "Mismatch Detection Using Replica Circuit", incorporated by reference above.

Note that a similar approach may be utilized in which the power measurement circuit 906 is coupled to the input and output of the PA 902 itself (i.e., the replica amplifier 904 is not used).

Figure 10:
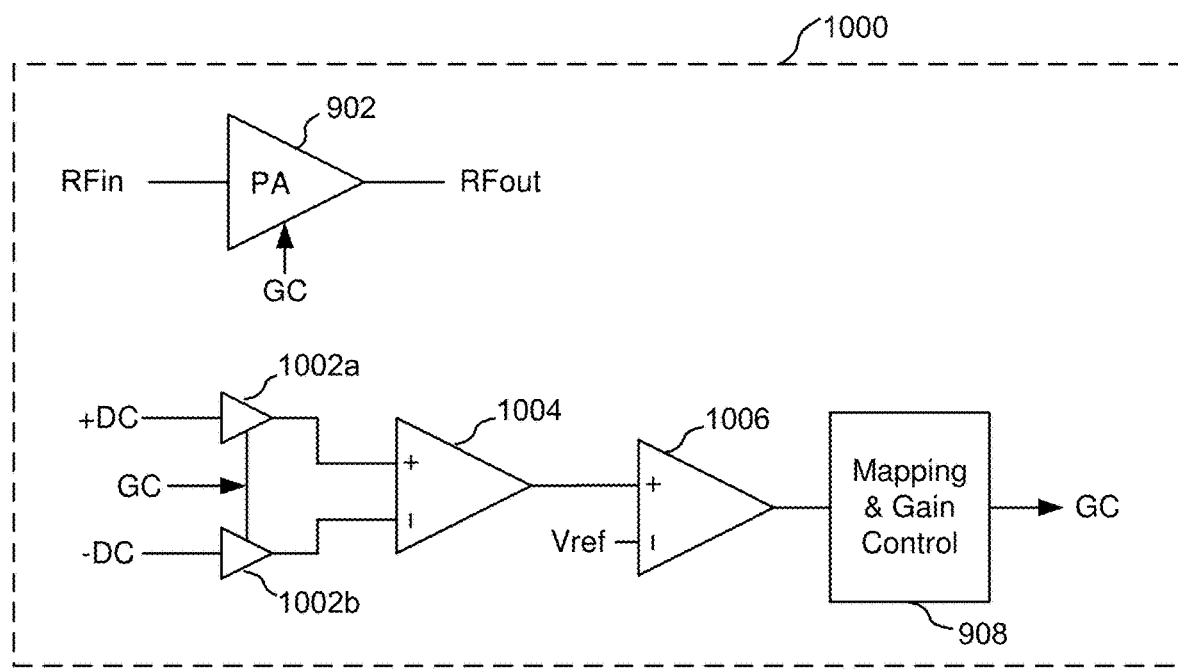
FIG. 10 is a second embodiment of an indirect temperature measurement gain control signal generation circuit.

FIG. 10 is a second embodiment of an indirect temperature measurement gain control signal generation circuit 1000. In this embodiment, instead of using an AC signal as reference signal as shown in FIG. 9, plus and minus DC voltages (e.g., 0.5V+10 mV=0.51V, and 0.5V−10 mV=0.49V) may be applied to a pair of scaled replica amplifiers 1002a, 1002b located in close proximity to a PA 902. The output of the replica amplifiers 1002a, 1002b may be applied to a first differential amplifier 1004.

The output of the first differential amplifier 1004 represents the gains of the replica amplifiers 1002a, 1002b, which are assumed to be equal and also equal to the gain of the PA 902. The output signal represents gain because the DC input signals are assumed to be known and accurate. As an example, if +DC=1V+0.1V, and −DC=1V−0.1V, then the difference between the input voltages is equal to (1+0.1)−(1−0.1)=0.2V. If the gain of the replica amplifiers 1002a, 1002b is 10, then the difference of the outputs of the replica amplifiers 1002a, 1002b is 10×0.2=2V. If the gain of the replica amplifiers 1002a, 1002b increases to 11 due to self-heating of the PA 902, then this output difference would increase to 2.2V. This difference voltage (that represents gain) is then compared to Vref in the second differential amplifier 1006 to determine if the difference value is too high or too low.

As with FIG. 9, the mapping and Gain control circuit 908 generates a suitable GC signal back to the PA 902 and the replica amplifiers 1002a, 1002b to boost their respective Gains in an amount sufficient to substantially offset the droop. The configuration of FIG. 10 thus allows determining the small-signal response of the replica amplifiers 1002a, 1002b by using DC measurements only. A variant of this architecture can also utilize a S&H circuit (not shown) in a similar fashion to the architecture described above for the S&H circuit variant of FIG. 9.

Placement of Temperature Sensing Circuits

Figure 11:
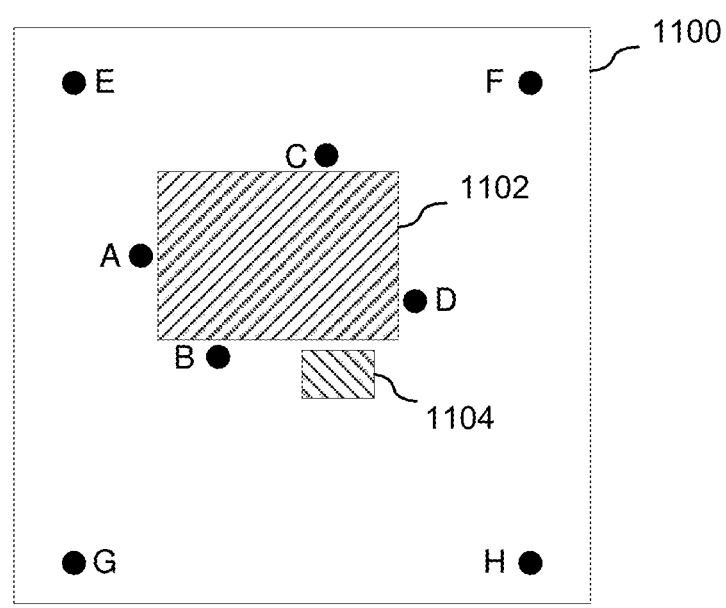
FIG. 11 is a top plan view of an example layout of an IC that includes a PA.

A particular power amplifier IC may include one or more temperature sensors for measuring PA self-heating during pulsed operation, and may include one or more temperature sensors for purposes of continuous temperature compensation. FIG. 11 is a top plan view of an example layout of an IC 1100 that includes a PA. This example includes a main region 1102 encompassing the circuitry for a PA, and a secondary region 1104 encompassing the circuitry for a replica amplifier. Shown are several possible locations A-D for PA pulsed-operation self-heating temperature sensors in close proximity to the main PA region 1102. Also shown are several possible locations E-H for continuous temperature compensation temperature sensors. Other locations and fewer or more locations may be used for either kind of temperature sensor. As described above, one or more replica amplifiers within the secondary region 1104 may also be used for indirect measurement of the self-heating of a PA in the adjacent main region 1102.

In many PA's having two amplifier stages, the final stage may generate as much as 80% of the PA heat, with the remainder of the PA heat generated by the driver stage. Accordingly, it is generally beneficial to place a PA pulsed-operation self-heating temperature sensor in close proximity to the final stage.

Close proximity of PA pulsed-operation self-heating temperature sensors to the power-consuming elements of a PA is important. While the concepts disclosed above work with sensor locations spaced away from a PA, distance increases the response time of measurement and hence introduces a lag in generation of a corrective GC signal.

In some applications, it may be useful to fabricate temperature sensors in multiple locations, such as locations A-H, and then determine which sensors in specific locations provide better performance (e.g., faster responding, better accuracy, stronger output signal, etc.). For example, in one test IC, 16 PA pulsed-operation self-heating temperature sensors were used to investigate optimal siting. Thereafter, the output from the selected sensors may be coupled to circuitry for compensating for PA self-heating during pulsed operation, or to suitable general continuous temperature compensation circuitry, as described above.

In other applications, it may be useful to include the output of several temperature sensors in determining a GC signal and/or a Continuous GC signal. For example, the output of the temperature sensors at locations A and B in FIG. 11 around the periphery of the main PA region 1102 could be determined (and scaled or weighted, if necessary) so as to provide an average of self-heating temperatures for the main PA region 1102.

When utilizing two or more continuous temperature sensing circuits 800 to determine $\Delta T = T(p) - T(d)$, as described above, a proximate location such as A-D may be paired with a distant location E-H.

Methods

Figure 12A:
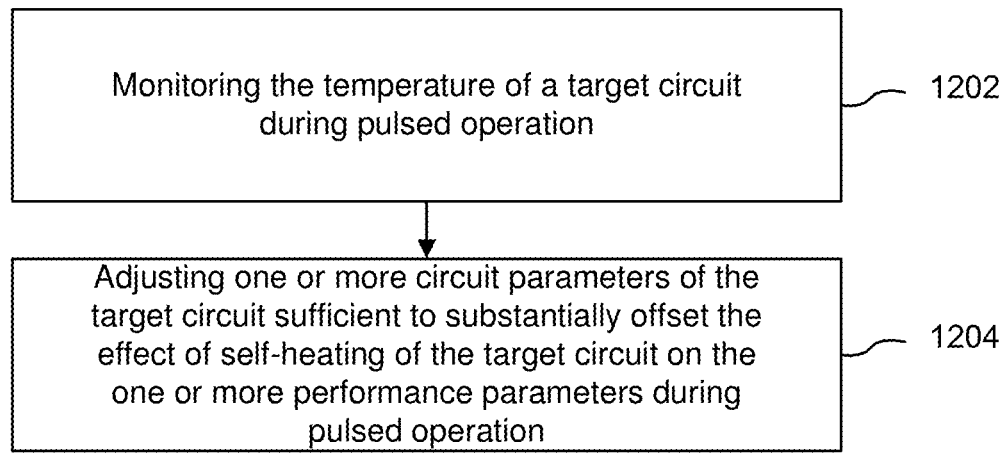
FIG. 12A is a process flow diagram of a first method for temperature compensating a target circuit having one or more performance parameters affected by self-heating during pulsed operation of the target circuit.

Another aspect of the invention includes method for temperature compensating a target circuit having one or more performance parameters affected by self-heating during pulsed operation of the target circuit. For example, FIG. 12A is a process flow diagram 1200 of a first method for temperature compensating a target circuit having one or more performance parameters affected by self-heating during pulsed operation of the target circuit. The method steps include: monitoring the temperature of the target circuit during pulsed operation (STEP 1202); and adjusting one or more circuit parameters of the target circuit sufficient to substantially offset the effect of self-heating of the target circuit on the one or more performance parameters during pulsed operation (STEP 1204).

Figure 12B:
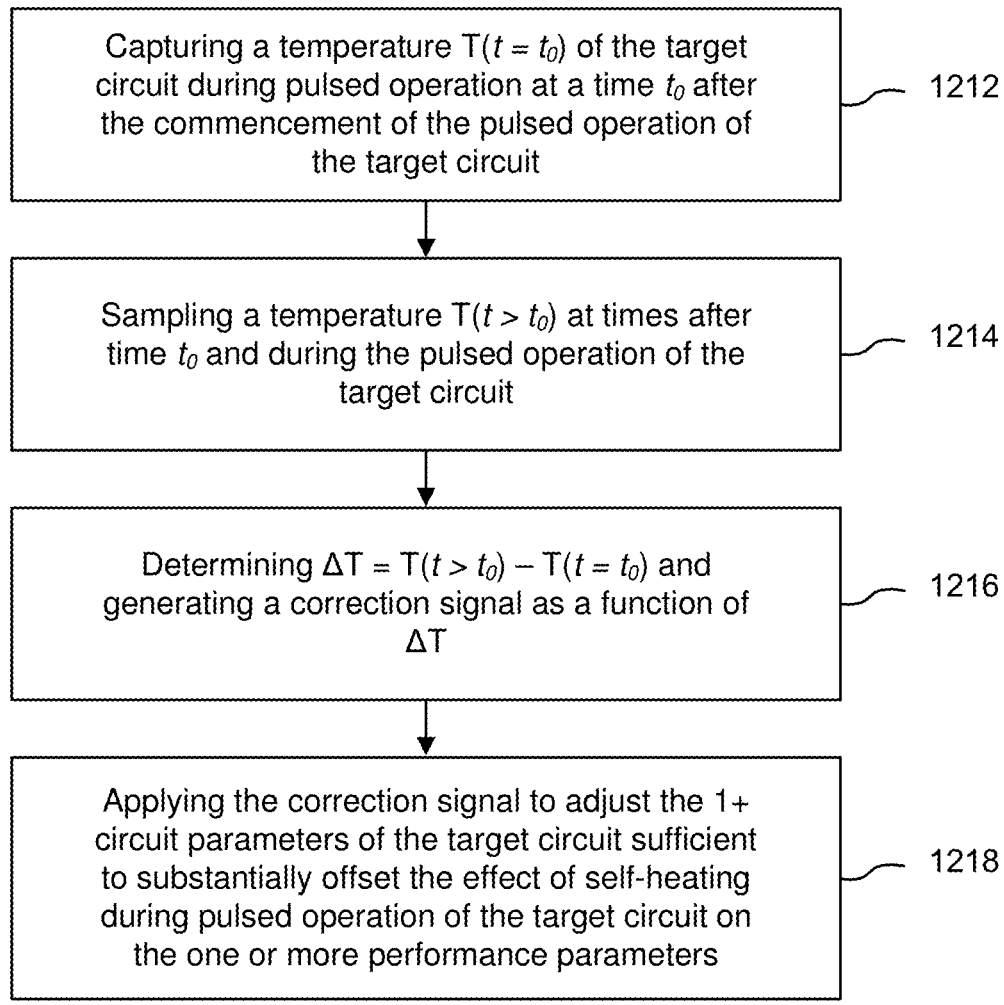
FIG. 12B is a process flow diagram of a second method for temperature compensating a target circuit having one or more performance parameters affected by self-heating during pulsed operation of the target circuit.

As another example, FIG. 12B is a process flow diagram 1210 of a second method for temperature compensating a target circuit having one or more performance parameters affected by self-heating during pulsed operation of the target circuit. The method steps include: capturing a temperature $T(t=t_0)$ of the target circuit during pulsed operation at a time to after the commencement of the pulsed operation of the target circuit (STEP 1212); sampling a temperature $T(t>t_0)$ at times after time to and during the pulsed operation of the target circuit (STEP 1214); determining $\Delta T = T(t>t_0) - T(t=t_0)$ and generating a correction signal as a function of $\Delta T$ (STEP 1216); and applying the correction signal to adjust the one or more circuit parameters of the target circuit sufficient to substantially offset the effect of self-heating during pulsed operation of the target circuit on the one or more performance parameters (STEP 1218).

Figure 12C:
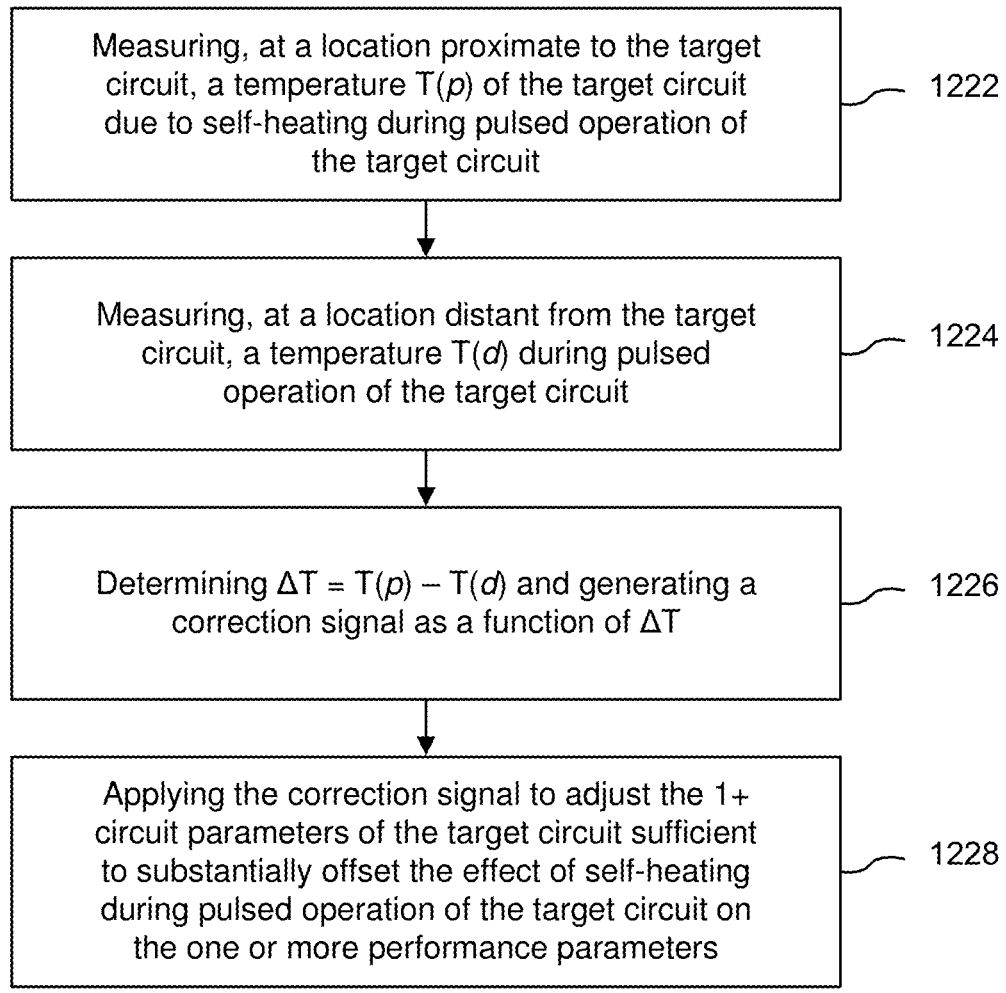
FIG. 12C is a process flow diagram of a third method for temperature compensating a target circuit having one or more performance parameters affected by self-heating during pulsed operation of the target circuit.

As yet another example, FIG. 12C is a process flow diagram 1220 of a third method for temperature compensating a target circuit having one or more performance parameters affected by self-heating during pulsed operation of the target circuit. The method steps include: measuring, at a location proximate to the target circuit, a temperature $T(p)$ of the target circuit due to self-heating during pulsed operation of the target circuit (STEP 1222); measuring, at a location distant from the target circuit, a temperature $T(d)$ during pulsed operation of the target circuit (STEP 1224); determining $\Delta T = T(p) - T(d)$ and generating a correction signal as a function of $\Delta T$ (STEP 1226); and applying the correction signal to adjust the one or more circuit parameters of the target circuit sufficient to substantially offset the effect of self-heating during pulsed operation of the target circuit on the one or more performance parameters (STEP 1228).

Variations of the above methods include sampling and holding $T(d)$ near the commencement of pulsed operation; the target circuit including a power amplifier and one of the performance parameters being at least one of a Gain or output power of the power amplifier during pulsed operation of the power amplifier; the target circuit including a power amplifier having at least one amplifier stage configured to receive an input radio frequency signal and output an amplified radio frequency signal, and the correction signal adjusting at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the power amplifier.

FIG. 12D is a process flow diagram 1230 of a method for temperature compensating a target circuit. The method includes: monitoring a circuit parameter of one of the target circuit or a scaled replica of the target circuit, where the circuit parameter varies as a function of self-heating of the target circuit during pulsed operation of the target circuit (STEP 1232); and adjusting one or more circuit parameters of the target circuit sufficient to substantially offset the effect of self-heating of the target circuit on the circuit parameter during pulsed operation (STEP 1234). A variation of this method includes the target circuit including a power amplifier and the monitored circuit parameter being a Gain of one of the power amplifier or at least one scaled replica of the power amplifier during pulsed operation of the power amplifier.

FIG. 12E is a process flow diagram 1240 of a method for temperature compensating an integrated circuit including (1) a power amplifier having a corresponding Gain that droops due to self-heating of the power amplifier during pulsed operation and (2) a temperature compensation circuit. The method includes: providing at least one scaled replica amplifier in close proximity to the power amplifier, each scaled replica amplifier having an input coupled to a reference signal and outputting an amplified reference signal, wherein each scaled replica amplifier has a corresponding Gain that droops due to self-heating of the power amplifier during pulsed operation of the power amplifier (STEP 1242); and providing a power measurement and correction circuit coupled to the reference signal and to the amplified reference signal, for determining a correction signal as a function of the reference signal and of the amplified reference signal, the correction signal being coupled to the power amplifier to adjust the Gain of the power amplifier sufficient to substantially offset the effect of self-heating of the power amplifier on the Gain of the power amplifier during pulsed operation of the power amplifier (STEP 1244).

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-onsapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly at the common WiFi frequencies of 2.4 GHz and 5 GHz, and even higher frequencies).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit including (1) an amplifier having a Gain that droops due to heating of the amplifier during operation, and (2) a temperature compensation circuit, the temperature compensation circuit including:
   (a) at least one sensor located with respect to the amplifier so as to measure the temperature of the amplifier and generate an output signal T representing such temperature;
   (b) at least one sample and hold circuit, each coupled to at least one sensor through an intermediate amplifier coupled between the at least one sensor and the at least one sample and hold circuit, configured to capture a temperature $T(t=t_0)$ at a time $t_0$ after commencement of operation of the amplifier, and to sample a temperature $T(t>t_0)$ at times after time $t_0$ during operation of the amplifier;
   (c) a comparison circuit, coupled to at least one sample and hold circuit, for determining a signal $\Delta T=T(t>t_0)-T(t=t_0)$; and
   (d) a mapping circuit, coupled to the comparison circuit, for receiving values of the signal $\Delta T$ and mapping the values of the signal $\Delta T$ to corresponding control signal values, the control signal values being coupled to one or more adjustable circuits on the integrated circuit to adjust one or more circuit parameters of the one or more circuits.

2. The invention of claim 1, wherein the control signal values are coupled to and adjust at least one of a Gain or output power of the amplifier during operation of the amplifier.

3. The invention of claim 1, wherein the amplifier includes at least one amplifier stage configured to receive an input radio frequency signal and output an amplified radio frequency signal, and wherein the control signal values are coupled to and adjust at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the amplifier.

4. The invention of claim 1, wherein mapping the values of the signal $\Delta T$ to corresponding control signal values includes applying at least one of an offset linear function, an inverse function, or a non-linear function.

5. The invention of claim 1, wherein mapping the values of the signal $\Delta T$ to corresponding control signal values includes applying at least a logarithmic function.

6. The invention of claim 1, wherein mapping the values of the signal $\Delta T$ to corresponding control signal values results in the control signal values being linear and proportionate with respect to the values of the signal $\Delta T$.

7. The invention of claim 1, wherein the mapping circuit converts the values of the signal $\Delta T$ to digital values and applies the digital values to a look-up table programmed with a desired mapping function in order to generate corresponding control signal values in digital form.

8. An integrated circuit including (1) a pulsed-operation amplifier having a Gain that droops due to heating of the amplifier during operation, and (2) a temperature compensation circuit, the temperature compensation circuit including:
   (a) at least one sensor located with respect to the amplifier so as to measure the temperature of the amplifier and generate an output signal T representing such temperature;
   (b) at least one sample and hold circuit, each coupled to at least one sensor through an intermediate amplifier coupled between the at least one sensor and the at least one sample and hold circuit, configured to capture a temperature $T(t=t_0)$ at a time $t_0$ after commencement of operation of the amplifier, and to sample a temperature $T(t>t_0)$ at times after time $t_0$ during operation of the amplifier;
   (c) a comparison circuit, coupled to at least one sample and hold circuit, for determining a signal $\Delta T=T(t>t_0)-T(t=t_0)$; and
   (d) a mapping circuit, coupled to the comparison circuit, for receiving values of the signal $\Delta T$ and mapping the values of the signal $\Delta T$ to corresponding control signal values, the control signal values being coupled to one or more adjustable circuits on the integrated circuit to adjust one or more circuit parameters of the one or more circuits, wherein the mapping circuit converts the values of the signal $\Delta T$ to digital values and applies the digital values to a look-up table programmed with a desired mapping function in order to generate corresponding control signal values in digital form.

9. The invention of claim 8, wherein the control signal values are coupled to and adjust at least one of a Gain or output power of the amplifier during operation of the amplifier.

10. The invention of claim 8, wherein the amplifier includes at least one amplifier stage configured to receive an input radio frequency signal and output an amplified radio frequency signal, and wherein the control signal values are coupled to and adjust at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the amplifier.

11. The invention of claim 8, wherein mapping the values of the signal $\Delta T$ to corresponding control signal values includes applying at least one of an offset linear function, an inverse function, or a non-linear function.

12. The invention of claim 8, wherein mapping the values of the signal $\Delta T$ to corresponding control signal values includes applying at least a logarithmic function.

13. The invention of claim 8, wherein mapping the values of the signal $\Delta T$ to corresponding control signal values results in the control signal values being linear and proportionate with respect to the values of the signal $\Delta T$.

14. An integrated circuit including (1) an amplifier having a Gain that droops due to self-heating of the amplifier during operation, and (2) a temperature compensation circuit, the temperature compensation circuit including:
  (a) at least one sensor located with respect to the amplifier so as to measure the temperature of the amplifier due to self-heating and generate an output signal T representing such temperature;
  (b) at least one sample and hold circuit, each coupled to at least one sensor through an intermediate amplifier coupled between the at least one sensor and the at least one sample and hold circuit, configured to capture a temperature $T(t=t_0)$ at a time to after commencement of operation of the amplifier, and to sample a temperature $T(t>t_0)$ at times after time to during operation of the amplifier;
  (c) a comparison circuit, coupled to at least one sample and hold circuit, for determining a signal $\Delta T=T(t>t_0)-T(t=t_0)$; and
  (d) a mapping circuit, coupled to the comparison circuit, for receiving values of the signal $\Delta T$ and mapping the values of the signal $\Delta T$ to corresponding control signal values, the control signal values being coupled to one or more adjustable circuits on the integrated circuit to adjust one or more circuit parameters of the one or more circuits sufficient to substantially offset the effect of self-heating on the Gain of the amplifier during operation of the amplifier.

15. The invention of claim 14, wherein the control signal values are coupled to and adjust at least one of a Gain or output power of the amplifier during operation of the amplifier.

16. The invention of claim 14, wherein the amplifier includes at least one amplifier stage configured to receive an input radio frequency signal and output an amplified radio frequency signal, and wherein the control signal values are coupled to and adjust at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the amplifier.

17. The invention of claim 14, wherein mapping the values of the signal $\Delta T$ to corresponding control signal values includes applying at least one of an offset linear function, an inverse function, or a non-linear function.

18. The invention of claim 14, wherein mapping the values of the signal $\Delta T$ to corresponding control signal values includes applying at least a logarithmic function.

19. The invention of claim 14, wherein mapping the values of the signal $\Delta T$ to corresponding control signal values results in the control signal values being linear and proportionate with respect to the values of the signal $\Delta T$.

20. The invention of claim 14, wherein the mapping circuit converts the values of the signal $\Delta T$ to digital values and applies the digital values to a look-up table programmed with a desired mapping function in order to generate corresponding control signal values in digital form.

\* \* \* \* \*